(12) United States Patent
Kwag et al.

(10) Patent No.: US 11,244,932 B2
(45) Date of Patent: Feb. 8, 2022

(54) DISPLAY APPARATUS

(71) Applicant: SAMSUNG ELECTRONICS CO., LTD., Suwon-si (KR)

(72) Inventors: Doyoung Kwag, Suwon-si (KR); Eunhye Kim, Suwon-si (KR); Sangmoo Park, Suwon-si (KR); Minsub Oh, Seoul (KR); Yoonsuk Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 79 days.

(21) Appl. No.: 16/675,944

(22) Filed: Nov. 6, 2019

(65) Prior Publication Data
US 2020/0144231 A1 May 7, 2020

(30) Foreign Application Priority Data
Nov. 6, 2018 (KR) .......................... 10-2018-0135136

(51) Int. Cl.
| | |
|---|---|
| *H01L 25/075* | (2006.01) |
| *H01L 33/62* | (2010.01) |
| *H01L 25/16* | (2006.01) |
| *H01L 23/00* | (2006.01) |
| *H01L 33/48* | (2010.01) |
| *H01L 33/38* | (2010.01) |
| *H01L 33/32* | (2010.01) |
| *H01L 33/06* | (2010.01) |

(52) U.S. Cl.
CPC .......... *H01L 25/0753* (2013.01); *H01L 24/06* (2013.01); *H01L 25/167* (2013.01); *H01L 33/48* (2013.01); *H01L 33/62* (2013.01); *H01L 33/06* (2013.01); *H01L 33/32* (2013.01); *H01L 33/38* (2013.01)

(58) Field of Classification Search
CPC ... H01L 25/0753; H01L 33/62; H01L 25/167; H01L 33/38; H01L 33/32; H01L 33/06
See application file for complete search history.

(56) References Cited

U.S. PATENT DOCUMENTS

| | | | |
|---|---|---|---|
| 8,646,505 B2 | 2/2014 | Bibi et al. | |
| 2012/0057610 A1* | 3/2012 | Dallesasse | H01S 5/141 |
| | | | 372/20 |
| 2014/0008691 A1* | 1/2014 | Tomoda | H01L 33/38 |
| | | | 257/99 |
| 2016/0336304 A1* | 11/2016 | Wu | H01L 21/6835 |

(Continued)

FOREIGN PATENT DOCUMENTS

| | | |
|---|---|---|
| JP | 4122784 B2 | 7/2008 |
| JP | 5912471 B2 | 4/2016 |

(Continued)

*Primary Examiner* — Ahmed N Sefer
(74) *Attorney, Agent, or Firm* — Sughrue Mion, PLLC (57) ABSTRACT

A display apparatus includes a substrate in which a plurality of pads are disposed, a plurality of micro LEDs, wherein each micro LED from among the plurality of micro LEDs is electrically connected to a respective group of pads from among the plurality of pads and mounted on the substrate, and a plurality of protrusion members, wherein each protrusion member from among the plurality of protrusion members protrudes from the substrate and is formed adjacent to a respective pad from among the plurality of pads.

14 Claims, 10 Drawing Sheets

(56) References Cited

U.S. PATENT DOCUMENTS

| | | | |
|---|---|---|---|
| 2017/0095582 A1* | 4/2017 | Shur | H01L 27/156 |
| 2017/0133558 A1 | 5/2017 | Sasaki et al. | |
| 2017/0358563 A1* | 12/2017 | Cho | H01L 33/38 |
| 2018/0012876 A1* | 1/2018 | Kim | H01L 33/387 |
| 2018/0019369 A1* | 1/2018 | Cho | H01L 25/0753 |
| 2018/0033853 A1* | 2/2018 | Bower | H01L 27/156 |
| 2019/0115513 A1* | 4/2019 | Im | H01L 25/0753 |
| 2019/0181317 A1* | 6/2019 | Yu | H01L 25/0753 |
| 2019/0189487 A1* | 6/2019 | Ahn | H01L 33/06 |
| 2019/0244567 A1* | 8/2019 | Cho | H01L 33/0095 |
| 2019/0251898 A1* | 8/2019 | Cho | G06F 3/042 |
| 2019/0259907 A1* | 8/2019 | Bibi | F21V 7/00 |
| 2020/0152835 A1* | 5/2020 | Ko | H01L 27/156 |
| 2020/0243715 A1* | 7/2020 | Atanackovic | H01L 33/0012 |
| 2020/0243739 A1* | 7/2020 | Fukaya | H05K 1/18 |

FOREIGN PATENT DOCUMENTS

| | | |
|---|---|---|
| KR | 10-1028255 B1 | 4/2011 |
| KR | 10-1789145 B1 | 10/2017 |

* cited by examiner

DISPLAY APPARATUS

CROSS-REFERENCE TO RELATED APPLICATION

This application is based on and claims priority under 35 U.S.C. § 119 to Korean Patent Application No. 10-2018-0135136, filed on Nov. 6, 2018, in the Korean Intellectual Property Office, the disclosure of which is incorporated by reference herein in its entirety.

BACKGROUND

1. Field

Devices and methods consistent with what is disclosed herein relate to a display apparatus, and more particularly, to a display apparatus with improved precision in the bonding of a micro LED to a substrate.

2. Description of Related Art

Semiconductor light emitting diodes (LEDs) are widely used as light sources for various display apparatuses of various electronic products such as TVs, mobile phones, PCs, laptop PCs, PDAs, etc. as well as light sources for lighting devices.

Recently, the size of the micro LED of less than 100 μm has been developed, and the micro LED has a faster response speed, a lower power, and a higher luminance than the conventional LED. Therefore, the micro LED of less than 100 μm is being spotlighted as a light emitting element of a next-generation display.

In the case of a flip chip type LED device of the micro LED device, the LED element is not only advantageous for miniaturization, light weight and high integration of a single device, but also improves the luminous efficiency and efficiency of the transfer process. Therefore, it is applied in the field of micro LED.

However, the micro LED may deviate from the preset position by heat treatment in the process of bonding the micro LED transferred to the substrate during the manufacturing of the display device. Thus, defects may occur due to the shift in position of the micro LED.

SUMMARY

In accordance with an aspect of the disclosure, a display apparatus includes a substrate in which a plurality of pads are disposed; a plurality of micro LEDs, wherein each micro LED from among the plurality of micro LEDs is electrically connected to a respective group of pads from among the plurality of pads and mounted on the substrate; and a plurality of protrusion members, wherein each protrusion member from among the plurality of protrusion members protrudes from the substrate and is formed adjacent to a respective pad from among the plurality of pads.

At least one protrusion member from among the plurality of protrusion members may protrude from an entire edge area of a respective pad from among the plurality of pads.

At least one protrusion member from among the plurality of protrusion members may protrude from a part of an entire edge area of a respective pad from among the plurality of pads.

The at least one protrusion member may be formed on an outer edge area of the respective pad based on a position of a center of a corresponding micro LED from among the plurality of micro LEDs.

The at least one protrusion member from among the plurality of protrusion members may surround a side surface of an electrode pad formed on a respective micro LED from among the plurality of micro LEDs.

A first electrode pad and a second electrode pad may be formed on each micro LED from among the plurality of micro LEDs, and the at least one protrusion member may be configured to surround side surfaces of the first electrode pad and the second electrode pad except for a first side surface of the first electrode pad and a second side surface of the second electrode pad where the first electrode pad and the second electrode pad face each other.

A thickness of the at least one protrusion member may be smaller than a thickness of the electrode pad.

At least one protrusion member from among the plurality of protrusion members may be formed of a conductive material.

Each pad from among the plurality of pads may correspond to at least one respective protrusion member from among the plurality of protrusion members that is disposed to surround an outer surface of the pad.

The respective group of pads may include a first pad and a second pad adjacent to the first pad, and a protrusion member from among the plurality of protrusion members may be disposed on outer surfaces of the first pad and the second pad except for a first surface of the first pad and a second surface of the second pad where the first pad and the second pad face each other.

A thickness of the at least one respective protrusion member may be smaller than a sum of a thickness of the corresponding pad and a thickness of an electrode pad formed on a micro LED from among the plurality of micro LEDs that corresponds to the corresponding pad.

The at least one respective protrusion member may be integrally embodied with the corresponding pad.

At least one protrusion member from among the plurality of protrusion members may be disposed between a first pad from among the respective group of pads and a second pad from among the respective group of pads, the group of pads all being connected to one micro LED from among the plurality of micro LEDs.

The at least one protrusion member may be formed of an insulating material.

A thickness of the at least one protrusion member may be smaller than a sum of a thickness of the respective group of pads and a thickness of a corresponding group of electrode pads formed on a respective micro LED from among the plurality of micro LEDs.

DETAILED DESCRIPTION

Hereinafter, embodiments of the display apparatus according to the disclosure will be described in detail with reference to the accompanying drawings.

In describing exemplary embodiments, detailed description of relevant known functions or components may be omitted if it would obscure the description of the subject matter. In addition, the redundant description of the same components will be omitted.

The terms such as "first," "second," and so on may be used to describe a variety of elements, but the elements should not be limited by these terms. The terms are used simply to distinguish one element from other elements. The use of such ordinal numbers should not be construed as limiting the meaning of the term. For example, without departing from the scope of the disclosure, the first component may be referred to as a second component, and similarly, the second component may also be referred to as a first component.

Unless otherwise defined, all terms (including technical and scientific terms) used herein have the same meaning as commonly understood by one of ordinary skill in the art to which this disclosure belongs.

In addition, terms such as 'up', 'down', 'front end', 'rear end', 'upper portion', 'lower portion', 'top', 'bottom' and the like used in the disclosure are defined on the basis of the drawings. However, the shape and position of each component are not limited by those terms.

Figure 1:
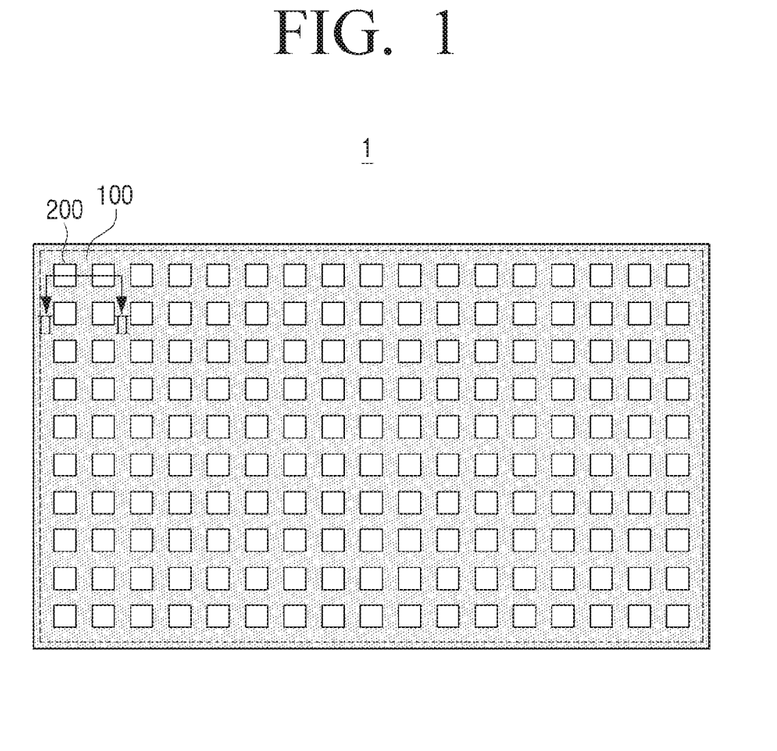
FIG. 1 is a schematic plane view according to an embodiment.
Figure 2:
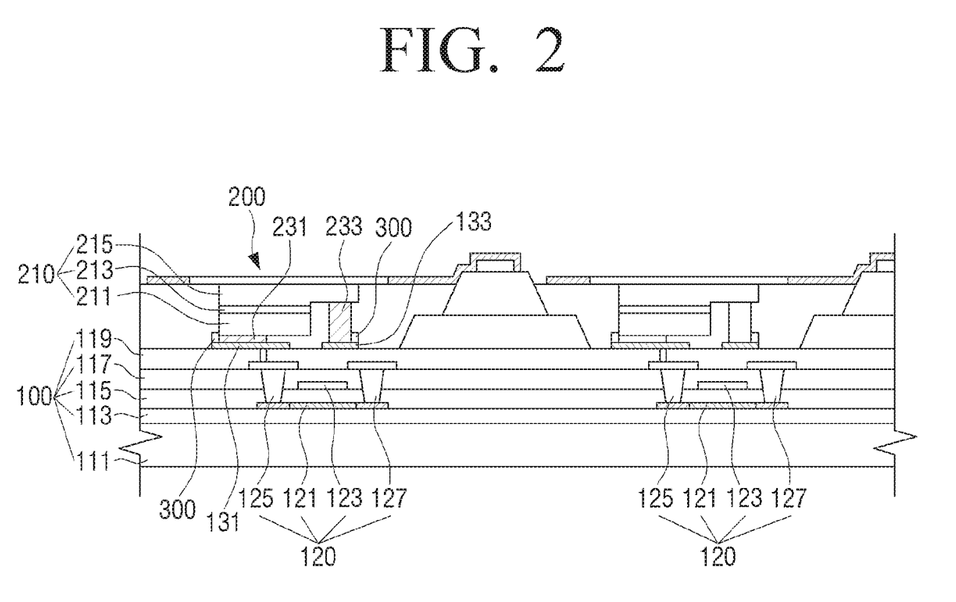
FIG. 2 is a cross-sectional view taken along line 'II-II' shown in FIG. 1.

FIG. 1 is a schematic plane view according to an embodiment of the disclosure, and FIG. 2 is a cross-sectional view taken along line 'II-II' shown in FIG. 1.

Referring to FIG. 1, a display apparatus 1 may include a substrate 100, and a plurality of micro LEDs 200 disposed on the substrate 100 at a predetermined regular interval. Each micro LED 200 may be disposed on the substrate 100 and may constitute light emitting modules of a display. The display module according to an embodiment of the disclosure may be applied to an electronic product or an electronic device that requires a wearable device, a portable device, a handheld device, or various displays, in a single unit. The display module can also be applied to a display device such as a monitor for a personal computer, a TV and digital signage, an electronic display through a plurality of assembly arrangements.

Referring to FIG. 2, the substrate 100 may include a thin film transistor (TFT) 120 for driving the micro LEDs 200. The thin film transistor 120 may be formed in the substrate 100.

Any type of material could be used for the substrate 100 as long as it could be used for a display or lighting. The substrate 100 may include a thin film transistor by a separated stacked structure, an integrated circuit or a metal wire. In addition, the substrate 100 may be a substrate in which a plurality of individual substrates are combined or bonded.

For example, the substrate 100 may include a base substrate 111, a thin film transistor 120 formed on the base substrate 111, and an insulation layer 119 formed on the thin film transistor 120.

The base substrate 111 may be formed of a ceramic material such as gallium nitride, glass, sapphire, quartz, silicon carbide, or the base substrate 111 may be a substrate made of an organic material or a flexible material such as polyethylene terephthalate, polyethylene naphthalate, polycarbonate, polyethersulfone, polycyclic olefins or polyimides, or the like. In addition, the base substrate 111 may have electrical thermal conductivity or electrical thermal insulation depending on the use example.

In order to form the thin film transistor 120, a buffer layer 113 may be formed on the base substrate 111. The buffer layer 113 may provide a flat surface above the base substrate 111, and block impurities or moisture from penetrating through the base substrate 111.

The thin film transistor 120 may include a channel layer 121, a gate electrode 123, a drain electrode 125, and a source electrode 127.

The insulation layer 119 may be formed on the thin film transistor 120. The insulation layer 119 may be formed to cover the thin film transistor 120, and may resolve the step (i.e., protrusion) resulting from inclusion of the thin film transistor 120.

A plurality of pads 131 and 133 may be formed on the substrate 100. The plurality of pads 131 and 133 connected to one micro LED 200 may include the first pad 131 and the second pad 133.

The first pad 131 may penetrate the insulation layer 119 to be electrically connected to the drain electrode 125 of the thin film transistor 120. The second pad 133 may be a common electrode that provides a reference voltage by applying a voltage for forming an electric field on the micro LED 200 between the first pad 131 and the second pad 133.

For example, the second pads 133 electrically connected to a plurality of respective micro LEDs 200 may be electrically connected to one another so that the same reference command voltage may be applied. The first pads 131 may each be connected to a respective individual thin film transistor 120.

The first pad 131 and the second pad 133 may be transparent electrodes or reflective electrodes. The reflective electrode may include a reflective film formed of one or more compounds of Ag, Mg, Al, Pt, Pd, Au, Ni, Nd, Ir, Cr, and the like, and a transparent or translucent electrode formed on the reflective film. The transparent or translucent electrode layer may include at least one of a conductive oxide such as indium tin oxide (ITO), indium zinc oxide (IZO), zinc oxide (ZnO), indium oxide (In2O3), indium gallium oxide (IGO) and aluminum zinc oxide (AZO).

The micro LED 200 may be disposed on the substrate 100, and the first electrode pad 231, and the second electrode pad 233 of the micro LED 200 may electrically contact the first pad 131 and the second pad 133 as shown, e.g., in FIG. 2.

The plurality of pads 131 and 133 may include a protrusion member 300 that fixedly supports the micro LED so that the micro LED may be disposed at a predetermined position relative to the plurality of pads 131 and 133.

The protrusion member 300 may protrude from the plurality of pads 131 and 133 to be formed adjacent to the plurality of pads 131 and 133. The detailed structure of the protrusion member 300 will be described below.

The micro LED 200 may emit ultraviolet (UV) rays and light having a wavelength of UV, red, green, or blue, and white light may also be realized by using a fluorescent material or combining colors. The light emitting module may be formed of the micro LED 200.

The micro LED 200 may have a size of 1 to 100 μm, but example embodiments of the disclosure may be applied to a light emitting diode larger than or smaller than the micro LED 200.

The micro LED 200 may include a first semiconductor layer 211, a second semiconductor layer 215, and an active layer 213 between the first semiconductor layer 211 and the second semiconductor layer 215.

The first semiconductor layer 211 may be implemented with, for example, a p-type semiconductor layer. The first semiconductor layer 211 may be a semiconductor material having a composition formula of InxAlyGa1-x-yN ($0 \leq x \leq 1$, $0 \leq y \leq 1$, $0 \leq x+y \leq 1$), for example, GaN, AlN, AlGaN, InGaN, InN, InAlGaN, AlInN and the like, and p-type dopants such as Mg, Zn, Ca, Sr, and Ba may be doped.

The second semiconductor layer 215 may be, for example, an n-type semiconductor layer. The second semiconductor layer 215 may be a semiconductor material having a composition formula of InxAlyGa1-x-yN ($0 \leq x \leq 1$, $0 \leq y \leq 1$, $0 \leq x+y \leq 1$), for example, GaN, AlN, AlGaN, InGaN, InN, InAlGaN, AlInN and the like, and n-type dopants such as Si, Ge, Sn, and the like may be doped.

The doping types of the first semiconductor layer 211 and the second semiconductor layer 215 are examples, but the disclosure is not limited thereto. The first semiconductor layer 211 may be an N-type semiconductor layer, and the second semiconductor layer 215 may be a P-type semiconductor layer.

The active layer 213 may be a region where electrons and holes are recombined, may transition to a low energy level as the electrons and holes are recombined, and may generate light having a wavelength corresponding thereto. The active layer 213 may be formed of, for example, a semiconductor material having a composition formula of InxAlyGa1-x-yN ($0 \leq x \leq 1$, $0 \leq y \leq 1$, $0 \leq x+y \leq 1$), and it may be formed of a quantum well structure or a multi quantum well structure (MQW). In addition, a quantum wire structure or a quantum dot structure may be included.

The micro LED 200 may include the first electrode pad 231 and the second electrode pad 233 disposed on one side of the micro LED 200.

The micro LED 200 may be a flip type, that is, the first electrode pad 231, and the second electrode pad 233 may be horizontally disposed on the same plane.

Figure 3:
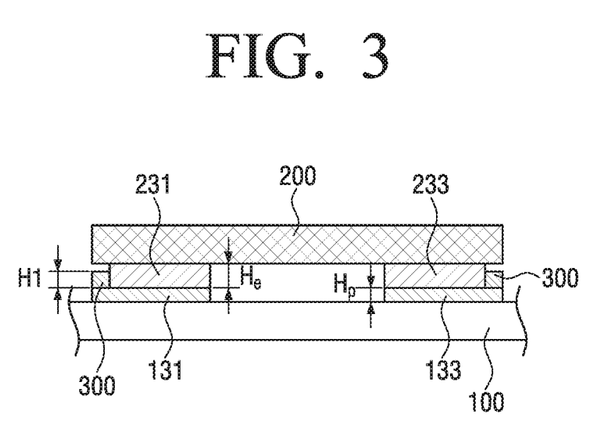
FIG. 3 is a schematic cross-sectional view illustrating a display apparatus according to an embodiment.
Figure 4:
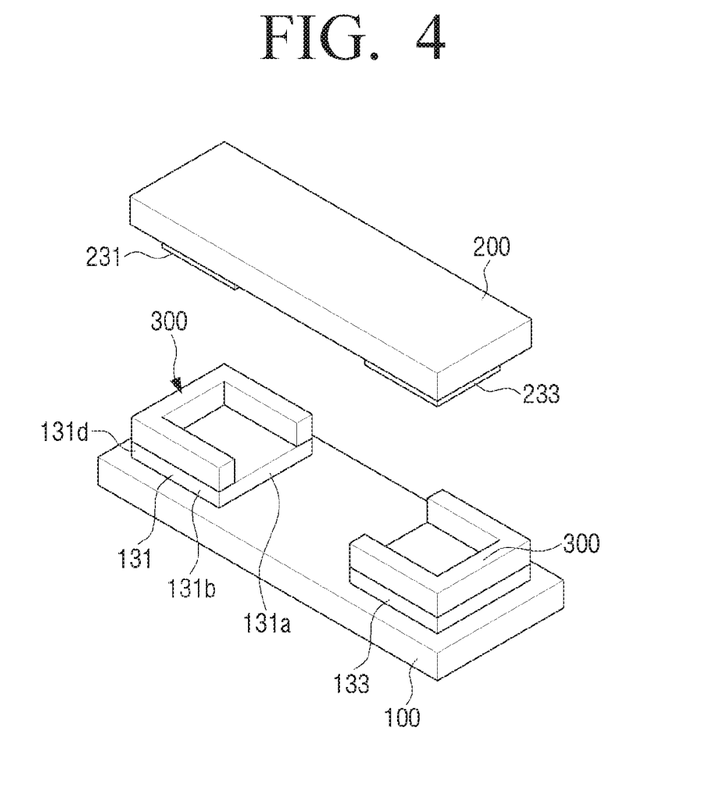
FIG. 4 is an exploded perspective view illustrating an LED and a substrate of a display apparatus according to an embodiment.

FIG. 3 is a schematic cross-sectional view illustrating a display apparatus according to an embodiment of the disclosure, and FIG. 4 is an exploded perspective view illustrating a micro LED and a substrate of a display apparatus according to an embodiment of the disclosure.

Referring to FIG. 3 and FIG. 4, the micro LED 200 may be disposed on the substrate 100, and the first electrode pad 231 and the second electrode pad 233 of the micro LED 200 may respectively electrically contact the first pad 131 and the second pad 133 disposed on the substrate 100 at predetermined intervals.

The micro LED 200 may be picked up on a wafer by a transfer equipment individually or together with other micro LEDs 200, transferred onto the substrate 100, and bonded to the substrate 100 to be mounted on the substrate 100.

Heat and pressure may be applied to the micro LED 200 in the process of bonding the micro LED 200 to the substrate 100. In the transferring process, even if the micro LED 200 is disposed so that the electrodes pads 231 and 233 may correspond to the pads 131 and 133, the micro LED 200 may be deviated from the position where the micro LED 200 is transferred by heat compression in the bonding process. In other words, shift may occur in a predetermined position of the micro LED 200.

The display apparatus 1 may include a protrusion member 300 that guides the micro LED 200 so as not to be moved from the fixed position in the process of bonding the micro LED 200.

The protrusion member 300 may protrude from the first pad 131 and the second pad 133.

The protrusion member 300 may partially protrude from a part of the edge area (i.e., the entire edge area) of the first pad 131 as shown, e.g., in FIG. 4. The protrusion member 300 may be formed on an edge area different from the edge area where the first pad 131 faces the second pad 133 on the first pad 131. The protrusion member 300 may be formed to cover the edge area of the first pad 131 in the '⊏'-like shape on the first pad 131. See, e.g., FIG. 4.

In a manner similar to the first pad 131, the second pad 133 may include the protrusion member 300 protruding from a part of the edge area of the upper surface of the second pad 133. The protrusion member 300 may be formed on the remaining edge area of the second pad 133 different from the edge area facing the first pad 131.

The protrusion member 300 may guide the positioning of the micro LED 200 such that the micro LED 200 may not move to the edge areas of the pads 131 and 133 in the process of bonding the micro LED 200.

The first electrode pad 231 of the micro LED 200 may be disposed on the first pad 131 to be electrically connected to the first pad 131. The first electrode pad 231 may be disposed to be accommodated in a space surrounded by the protrusion member 300.

The protrusion member 300 may be formed of a conductive member. The protrusion member 300 may be formed with the same material as that of the plurality of pads 131 and 133. For example, the protrusion member 300 may include one or more compounds of Ag, Mg, Al, Pt, Pd, Au, Ni, Nd, Ir, Cr, or a conductive oxide such as indium tin oxide (ITO), indium zinc oxide (IZO), zinc oxide (ZnO), indium oxide (In2O3), indium gallium oxide (IGO), and aluminum zinc oxide (AZO). Accordingly, the protrusion member 300 may allow the first electrode pad 231 and the first pad 131 to be in electrical contact with each other.

The first electrode pad 231 may be disposed on the first pad 131 so that the outer surface may be surrounded by the protrusion member 300. The protrusion 300 may be formed to surround a second side surface 131*b*, a third side surface 131*c*, and a fourth side surface 131*d* and may be formed not to surround a first side surface 131*a* facing the second electrode pad 233 of the first electrode pad 231. See, e.g., FIG. 5.

A thickness H1 of the protrusion member 300 may be smaller than a thickness He of the first electrode pad 231 so that the first electrode pad 231 and the first pad 131 may electrically contact each other. The outer side surface of the first electrode pad 231 may be surrounded by the protrusion member 300.

In addition, only the partial area of the outer surface of the first electrode pad 231 may be surrounded by the protrusion member 300. The protrusion member 300 formed on the first pad 131 may be configured to support the micro LED 200 so as not to move relative to the substrate 100, and configured to support the part of one surface of the first electrode pad 231.

In the same manner that the first electrode pad 231 is electrically connected to the first pad 131, the second electrode pad 233 of the micro LED 200 may be disposed on the second pad 133 to be electrically connected to the second pad 133. The second electrode pad 233 may be disposed to be accommodated in the space surrounded by the protrusion member 300. The arrangement structure of the second electrode pad 233 and the second pad 133 may be the same as the arrangement structure of the first electrode pad 231 and the first pad 131. Thus, the repeated description will be omitted.

Figure 5:
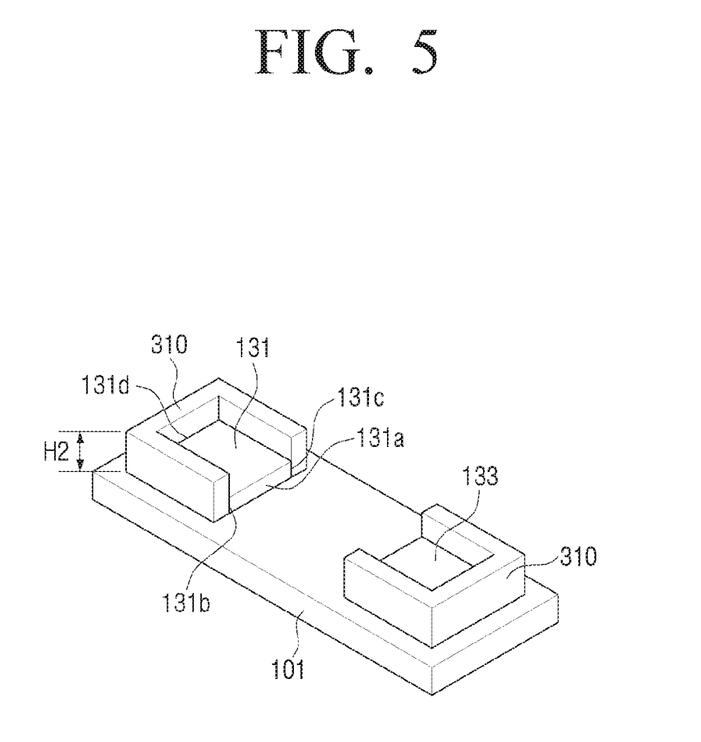
FIG. 5 is a perspective view illustrating a substrate according to an embodiment.

FIG. 5 is a perspective view illustrating a substrate according to an embodiment.

Referring to FIG. 5, a display apparatus according to another example embodiment has the same configuration as the display apparatus 1 described in FIG. 3. However, there is a difference in that the protrusion member 310 may be formed adjacent to the side surface of the pads 131 and 133 instead of on the top surface of the pads 131 and 133. Therefore, the detailed description of the configuration of the substrate 101 of the display apparatus repeated from that of the substrate 100 in FIG. 3 will be omitted, and the arrangement structure of the protrusion member 310, which is the difference in FIG. 5, will be described below.

The protrusion member 310 may be disposed on the substrate 101 to surround the part of the outer surface of the first pad 131.

The protrusion member 310 may be formed to be adjacent to the outer surface of the first pad 131. The protrusion member 310 may be disposed to surround the second side surface 131b, the third side surface 131c, and the fourth side surface 131d and not to surround the first side surface 131a facing the second pad 133 of the first pad 131. The protrusion member 310 may be formed to surround the first pad 131 in the '⊏'-like shape.

In a manner similar to that of the first pad 131, the protrusion member 310 may be formed to surround the outer surface of the second pad 133. The second pad 133 may have the same structure as the first pad 133, and thus the repeated description will be omitted.

The thickness H2 of the protrusion member 310 may be smaller than the sum of a thickness Hp of the first pad 131 and a thickness He of the first electrode pad 231. The outer surface of the first electrode pad 231 may be surrounded by the protrusion member 300.

The first electrode pad 231 of the micro LED 200 may be electrically connected to the first pad 131 to be accommodated in the space surrounded by the protrusion member 300.

Figure 6:
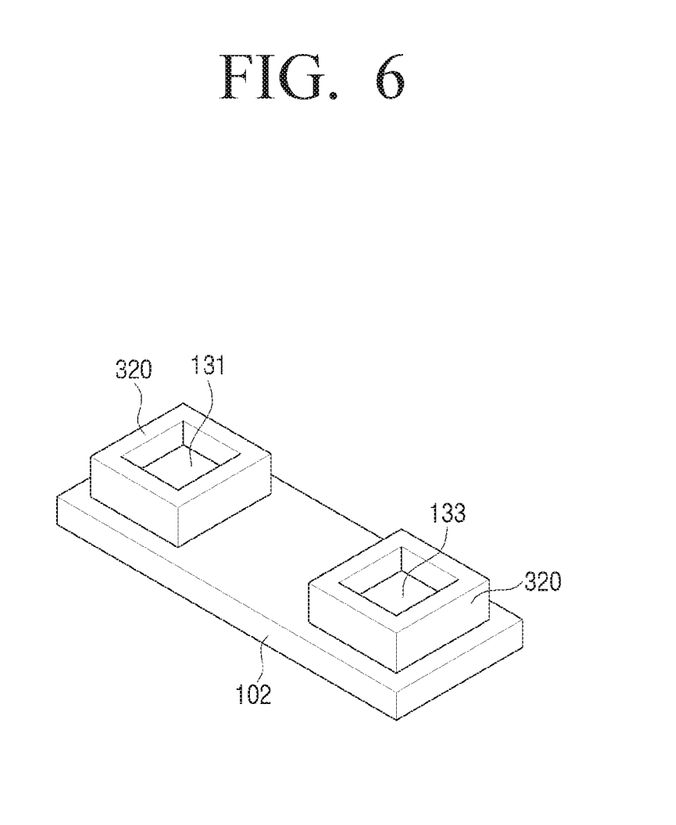
FIG. 6 is a perspective view illustrating a substrate according to an embodiment.

FIG. 6 is a perspective view illustrating a substrate according to an embodiment.

Referring to FIG. 6, a display apparatus according to another embodiment of the disclosure has the same configuration as the display apparatus shown in FIG. 3. However, there is a difference in that the protrusion member 320 may protrude from all of the edge areas (i.e., from an entire edge area) of the first pad 131 and the second pad 133. Therefore, the detailed description of the configuration of the substrate 102 of the display apparatus repeated from that of the substrate 100 in FIG. 3 will be omitted, and the arrangement structure of the protrusion member 320, which is the difference in FIG. 6, will be described below.

The protrusion member 320 may protrude from the first pad 131 and the second pad 133. The protrusion member 320 may be formed on all of the edge area of the first pad 131.

In a manner similar to that of the first pad 131, the protrusion member 320 may be formed to surround all of the edge area of the second pad 133. The second pad 133 may have the same structure as the first pad 131, and thus the repeated description will be omitted.

The first electrode pad 231 of the micro LED 200 may be accommodated in the space surrounded by the protrusion member 320 and electrically connected to the first pad 131. The thickness of the protrusion member 320 may be smaller than the sum of the thickness Hp of the first pad 131 and the thickness He of the first electrode pad 231.

The protrusion member 320 may be disposed on the substrate 102, and disposed adjacent to the first pad 131 to surround all of the outer surface of the first pad 131.

Figure 7:
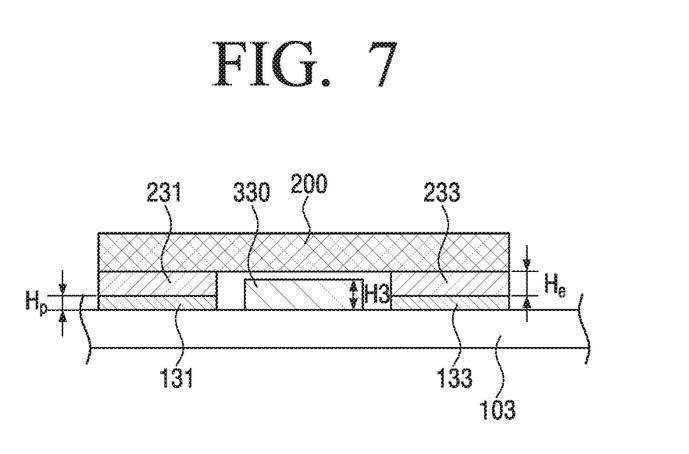
FIG. 7 is a schematic cross-sectional view illustrating a display apparatus according to an embodiment.
Figure 8:
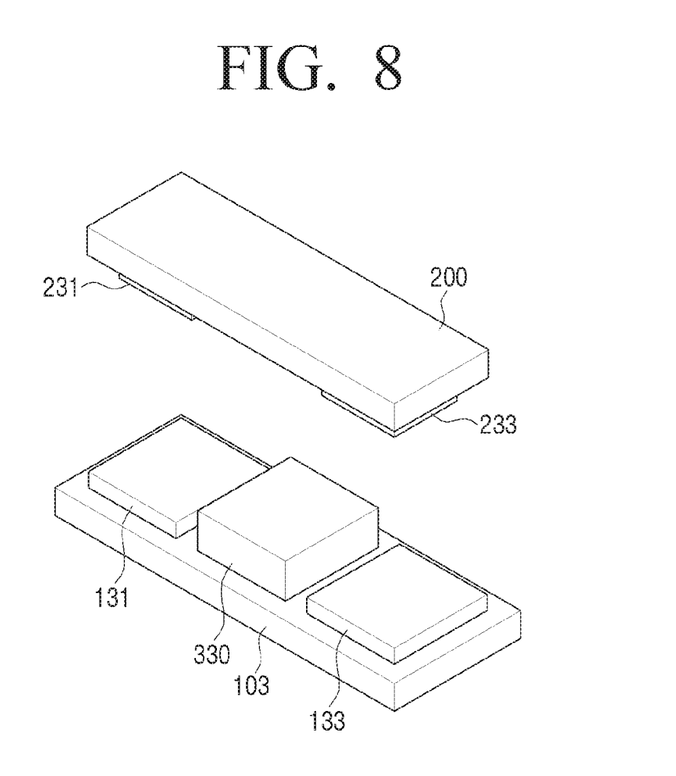
FIG. 8 is an exploded perspective view illustrating an LED and a substrate of a display apparatus according to an embodiment.

FIG. 7 is a schematic cross-sectional view illustrating a display apparatus according to an embodiment, and FIG. 8 is an exploded perspective view illustrating an LED and a substrate of a display apparatus according to an embodiment.

Referring to FIG. 7 and FIG. 8, the display apparatus according to another embodiment of the disclosure has the same configuration as the display apparatus 1 shown in FIG. 3. However, there is a difference in that the protrusion member 330 may be disposed between first pad 131 and second pad 133. Therefore, the detailed description of the configuration of the display apparatus repeated from that of the substrate 100 in FIG. 3 will be omitted, and the arrangement structure of the protrusion member 330, which is the difference in FIG. 7 and FIG. 8, will be described below.

The protrusion member 330 may be disposed between a plurality of pads in which the substrate 103 is connected to the micro LED 200.

The protrusion member 330 may protrude from the substrate 103. The protrusion member 330 may be disposed between the first pad 131 and the second pad 133 connected to the micro LED 200.

The protrusion 330 may be disposed between the first pad 131 and the second pad 133 formed on the substrate 103 so that the LED 200 may be disposed at positions corresponding to the first pad 131 and the second pad 133. The protrusion member 330 may guide the positioning of the micro LED 200 such that the micro LED 200 may not move from a predetermined position in the process of bonding the micro LED 200.

It is illustrated that the cross-section of the protruding member 330 is a square shape, but the disclosure is not limited thereto. For example, the cross-section may have a trapezoidal shape such that the farther away from the substrate 103, the smaller the angle. In other words, a width of the protrusion member 330 may decrease with distance from the substrate 103.

The protrusion member 330 may be formed of an insulation material. Accordingly, the protrusion member 330 may insulate between the first pad 131 and the second pad 133. The protrusion member 330 may maintain the first pad 131 and the second pad 133 of the substrate 103 in a short state.

The thickness H3 of the protrusion member 330 may be formed to be smaller than the sum of the thickness Hp of the first pad 131 and the thickness He of the first electrode pad 231. The internal surfaces of the first electrode pad 231 and the first pad 131 may be surrounded by the protrusion member 330.

The internal surface of the first electrode pad 231 may be surrounded by the protrusion member 330. In other words, a side of the first electrode pad 231 that faces the second electrode pad 233 may also face the protrusion member 330. In a manner similar to that of the first electrode pad 231, the internal surface of the second electrode pad 233 may be surrounded by the protrusion member 330. The protrusion member 330 formed on the substrate 103 may support the micro LED 200 such that the micro LED 200 may not move, and may be configured to support the internal surface of the first electrode pad 231 and the internal surface of the second electrode pad 233.

The arrangement structure of the second electrode pad 233 and the second pad 133 may be the same as that of the first electrode pad 231 and the first pad 131, and thus the repeated description will be omitted.

Figure 9:
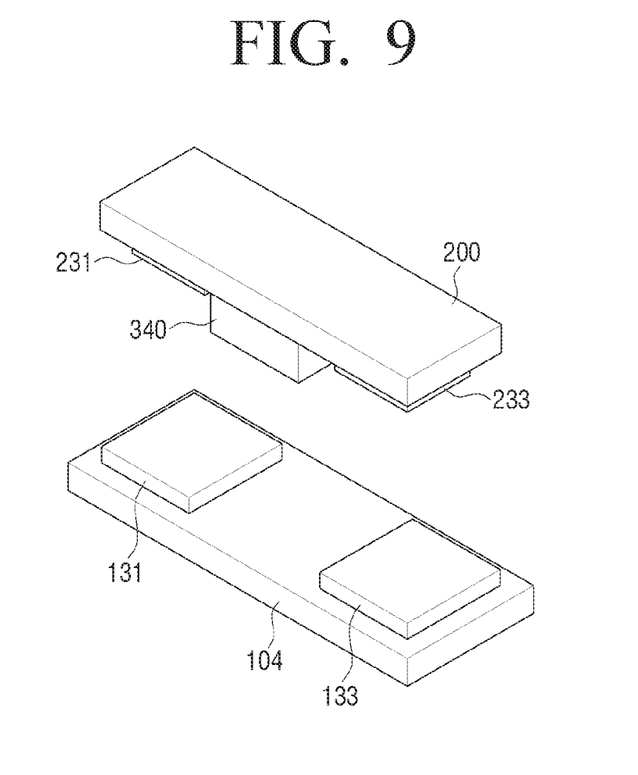
FIG. 9 is an exploded perspective view illustrating an LED and a substrate of a display apparatus according to an embodiment.

FIG. 9 is an exploded perspective view illustrating an LED and a substrate of a display apparatus according to an embodiment.

Referring to FIG. 9, a display apparatus according to another embodiment may have the same configuration as the display apparatus shown in FIG. 8. However, there is a difference in that the protrusion member 340 may protrude from the lower surface of the micro LED 200. Therefore, the detailed description of the configuration of the display apparatus repeated from that of the substrate 104 in FIG. 3 will be omitted, and the arrangement structure of the protrusion member 340, which is the difference in FIG. 9, will be described below.

The protrusion member 340 may be formed on the micro LED 200. To be specific, the protrusion member 340 may protrude from the lower surface of the micro LED 200. The protrusion member 340 may be disposed between the first pad 131 and the second pad 133 connected to the substrate 104.

The protrusion member 340 may be disposed between the first electrode pad 231 and the second electrode pad 233 connected to the micro LED 200 such that a position of the micro LED 200 may be maintained to correspond to the first pad 131 and the second pad 133. The protrusion member 340 may guide the positioning of the micro LED 200 such that the micro LED 200 may not move from the predetermined position in the process of bonding the micro LED 200.

It is illustrated that the cross-section of the protrusion member 340 is a square, but the disclosure is not limited thereto. For example, the cross-section may have a trapezoidal shape such that the farther away from the substrate 104, the smaller the angle, and the cross section may have a trapezoidal shape. In other words, a width of the protrusion member 340 may decrease with distance from the substrate 104.

The protrusion member 340 may be formed of an insulating material.

The internal surface of the first pad 131 may be surrounded by the protrusion member 340. In other words, a side of the first electrode pad 231 that faces the second electrode pad 233 may also face the protrusion member 340. In a manner similar to that of the first pad 131, the internal surface of the second pad 133 may be surrounded by the protrusion member 340. The protrusion member 340 formed on the micro LED 200 may support the internal surface of the first pad 131 and the second pad 133. The arrangement structure of the second electrode pad 233 and the second pad 133 may have the same arrangement structure as the first electrode pad 231 and the first pad 131. Therefore, the repeated description will be omitted.

Figure 10:
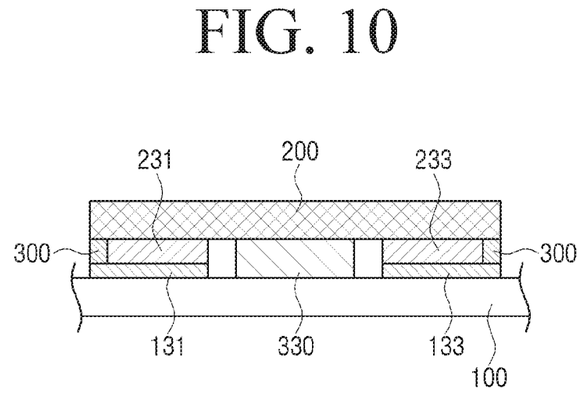
FIG. 10 is a schematic cross-sectional view illustrating a display apparatus according to an embodiment.

Referring to FIG. 10, the display apparatus according to an embodiment has the same configuration as the display apparatus shown in FIG. 3. However, there is a difference in that the protrusion member is disposed both on the first pad 131 and the second pad 133, and between a connection area of the micro LED 200.

The protrusion may include the first protrusion member 300 protruding from the edge area of each of the first pad 131 and the second pad 133, and the second protrusion member 330 formed between the connection area of the micro LED 200.

The position movement that may occur in the process of bonding the substrate 100 and the micro LED 200 may be prevented or minimized by inclusion of the first protrusion member 300 and the second protrusion member 330. The display apparatus according to an embodiment may guide the positioning of the micro LED 200 so that the micro LED 200 may not move effectively from the fixed position.

In the above, the present disclosure has been described by way of example. The terminology used herein is for the purpose of description and should not be regarded as limiting. Many modifications and variations of the present disclosure are possible in light of the above teachings. Accordingly, unless otherwise indicated, the present disclosure may be embodied freely within the scope of the claims.

Although embodiments have been shown and described, it will be appreciated by those skilled in the art that changes may be made to these embodiments without departing from the principles and spirit of the disclosure. Accordingly, the scope of the disclosure is not construed as being limited to the described embodiments, but is defined by the appended claims as well as equivalents thereto.

What is claimed is:

1. A display apparatus, comprising:
a substrate in which a plurality of pads are disposed;
a plurality of LEDs, wherein each LED from among the plurality of LEDs is electrically connected to a respective group of pads from among the plurality of pads and mounted on the substrate; and
a plurality of protrusion members, wherein each protrusion member from among the plurality of protrusion members protrudes from the substrate and is formed adjacent to a respective pad from among the plurality of pads without directly contacting any portion of any LED of the plurality of LEDs,
wherein a first electrode pad and a second electrode pad are formed on each LED from among the plurality of LEDs, and
wherein at least one protrusion member from among the plurality of protrusion members is configured to surround side surfaces of the first electrode pad and the second electrode pad except for a first side surface of the first electrode pad and a second side surface of the second electrode pad where the first electrode pad and the second electrode pad face each other.

2. The apparatus as claimed in claim 1, wherein at least one other protrusion member from among the plurality of protrusion members protrudes from an entire edge area of a respective pad from among the plurality of pads.

3. The apparatus as claimed in claim 2, wherein at least one protrusion member from among the plurality of protrusion members is formed of a conductive material.

4. The apparatus as claimed in claim 1, wherein the at least one protrusion member protrudes from a part of an entire edge area of a respective pad from among the plurality of pads.

5. The apparatus as claimed in claim 4, wherein the at least one protrusion member is formed on an outer edge area of the respective pad based on a position of a center of a corresponding LED from among the plurality of LEDs.

6. The apparatus as claimed in claim 4, wherein the at least one protrusion member from among the plurality of protrusion members surrounds a side surface of an electrode pad formed on a respective LED from among the plurality of LEDs.

7. The apparatus as claimed in claim 6, wherein a thickness of the at least one protrusion member is smaller than a thickness of the electrode pad.

8. The apparatus as claimed in claim 1, wherein each pad from among the plurality of pads corresponds to at least one respective protrusion member from among the plurality of protrusion members that is disposed to surround an outer surface of the pad.

9. The apparatus as claimed in claim 8, wherein the respective group of pads comprises a first pad and a second pad adjacent to the first pad, and
wherein a protrusion member from among the plurality of protrusion members is disposed on outer surfaces of the first pad and the second pad except for a first surface of the first pad and a second surface of the second pad where the first pad and the second pad face each other.

10. The apparatus as claimed in claim 8, wherein a thickness of the at least one respective protrusion member is smaller than a sum of a thickness of the corresponding pad and a thickness of an electrode pad formed on a LED from among the plurality of LEDs that corresponds to the corresponding pad.

11. The apparatus as claimed in claim 8, wherein the at least one respective protrusion member is integrally embodied with the corresponding pad.

12. The apparatus as claimed in claim 1, wherein at least one protrusion member from among the plurality of protrusion members is disposed between a first pad from among the respective group of pads and a second pad from among the respective group of pads, the group of pads all being connected to one LED from among the plurality of LEDs.

13. The apparatus as claimed in claim 12, wherein the at least one protrusion member is formed of an insulating material.

14. The apparatus as claimed in claim 12, wherein a thickness of the at least one protrusion member is smaller than a sum of a thickness of the respective group of pads and a thickness of a corresponding group of electrode pads formed on a respective LED from among the plurality of LEDs.

* * * * *